(12) United States Patent
Kirihara

(10) Patent No.: US 6,876,596 B1
(45) Date of Patent: Apr. 5, 2005

(54) DECODER CIRCUIT WITH FUNCTION OF PLURAL SERIES BIT LINE SELECTION

(75) Inventor: Masaharu Kirihara, Beacon, NY (US)

(73) Assignee: Halo LSI, Inc., Hillsboro, OR (US)

( * ) Notice: Subject to any disclaimer, the term of this patent is extended or adjusted under 35 U.S.C. 154(b) by 0 days.

(21) Appl. No.: 10/704,438

(22) Filed: Nov. 7, 2003

Related U.S. Application Data

(60) Provisional application No. 60/424,773, filed on Nov. 8, 2002.

(51) Int. Cl.[7] .................................................. G11C 8/00
(52) U.S. Cl. ................................... 365/230.06; 365/196
(58) Field of Search ........................... 365/230.06, 196, 365/191

(56) References Cited

U.S. PATENT DOCUMENTS

| | | | |
|---|---|---|---|
| 5,199,033 A | * | 3/1993 | McGeoch et al. .......... 365/168 |
| 5,784,327 A | * | 7/1998 | Hazani ....................... 365/218 |
| 6,011,725 A | | 1/2000 | Eitan ...................... 365/185.33 |
| 6,081,456 A | | 6/2000 | Dadashev ............. 365/185.23 |
| 6,181,597 B1 | | 1/2001 | Nachumovsky ........ 365/185.03 |
| 6,248,633 B1 | | 6/2001 | Ogura et al. ................. 438/267 |

* cited by examiner

*Primary Examiner*—Thong Q. Le
(74) *Attorney, Agent, or Firm*—George O. Saile; Stephen B. Ackerman

(57) ABSTRACT

A bit line decoding circuit for accessing an array of two-bit memory cells. Two adjacent memory cells can be accessed by applying appropriate voltages to the terminals of the cells. A bit line decoder selects plural bit lines in the memory array and provides paths to apply or receive the voltages to or from the selected bit lines. In one embodiment, shared control gates of pass transistors which function as the bit line selection in a bit line deocder provides reduction in the number of control signals. Functions of applying a voltage for neighbor effect reduction and of providing a path for a reference voltage are also implemented in further embodiments.

64 Claims, 11 Drawing Sheets

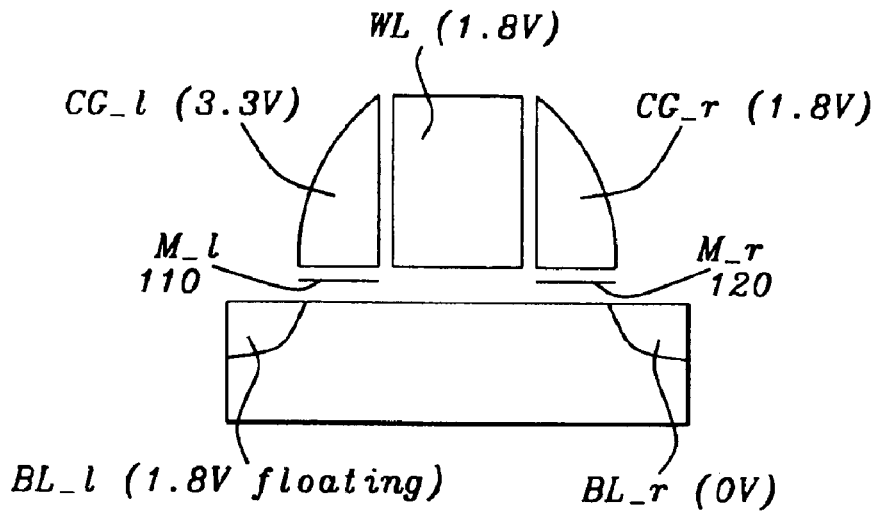
*FIG. 1 - Prior Art*
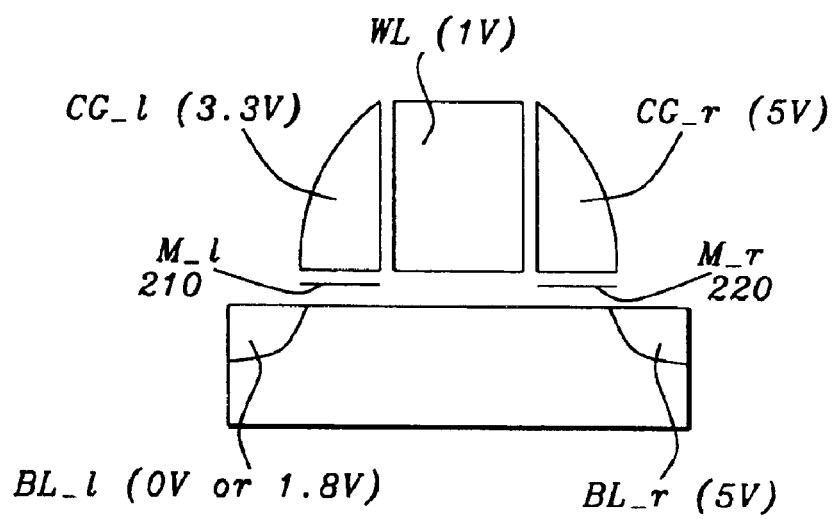
*FIG. 2 - Prior Art*

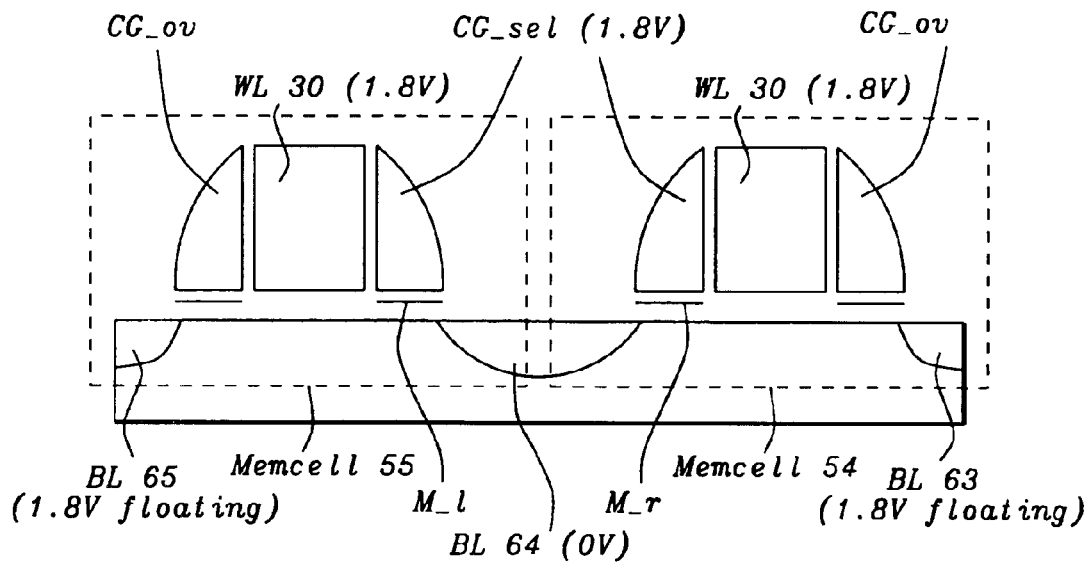
FIG. 3a – Prior Art
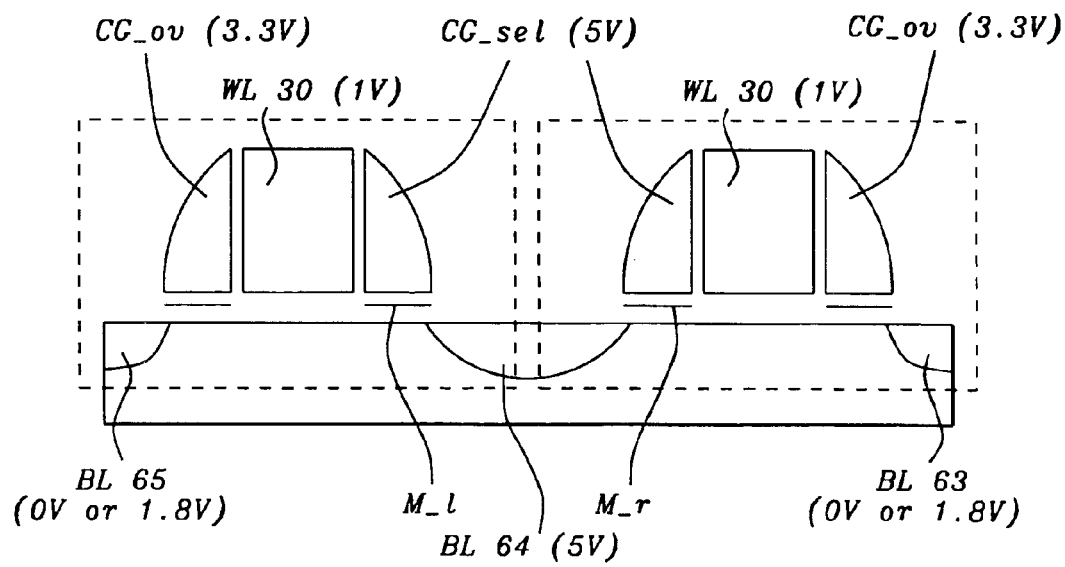
FIG. 3b – Prior Art

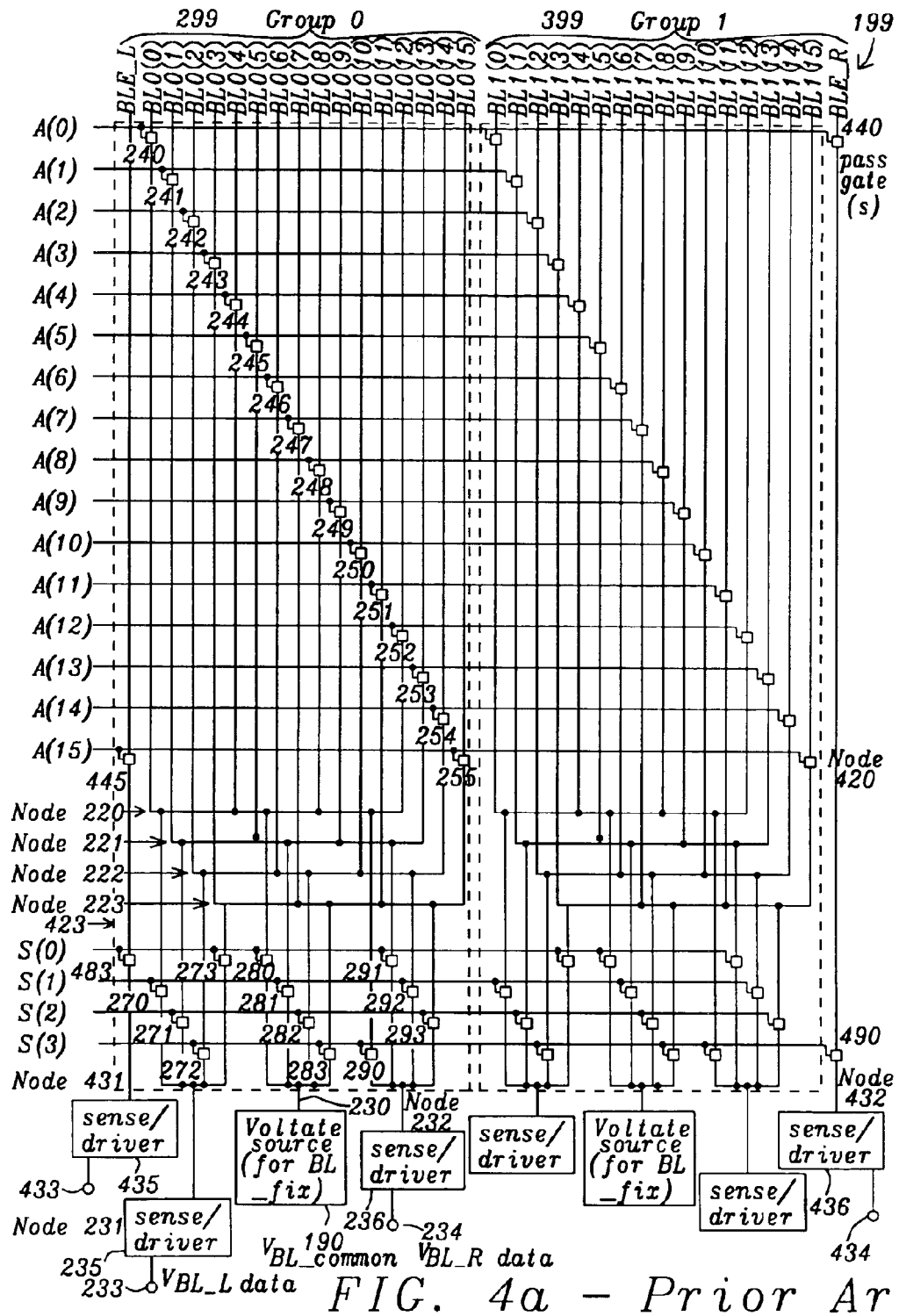
FIG. 4a – Prior Art

| BL_l | BL_fix | BL_r | A(x) 0 | 1 | 2 | 3 | 4 | 5 | 6 | 7 | 8 | 9 | 10 | 11 | 12 | 13 | 14 | 15 | S(x) 0 | 1 | 2 | 3 |
|---|---|---|---|---|---|---|---|---|---|---|---|---|---|---|---|---|---|---|---|---|---|---|
| BLE_L BL0(15) | BL0(0) BL1(0) | BL0(1) BL1(0) | o | o | x | x | x | x | x | x | x | x | x | x | x | x | x | o | o | x | x | x |
| BL0(0) BL1(0) | BL0(1) BL1(1) | BL0(2) BL1(2) | o | o | o | x | x | x | x | x | x | x | x | x | x | x | x | x | x | o | x | x |
| BL0(1) BL1(1) | BL0(2) BL1(2) | BL0(3) BL1(3) | x | o | o | o | x | x | x | x | x | x | x | x | x | x | x | x | x | x | o | x |
| BL0(2) BL1(2) | BL0(3) BL1(3) | BL0(4) BL1(4) | x | x | o | o | o | x | x | x | x | x | x | x | x | x | x | x | x | x | x | o |
| BL0(3) BL1(3) | BL0(4) BL1(4) | BL0(5) BL1(5) | x | x | x | o | o | o | x | x | x | x | x | x | x | x | x | x | o | x | x | x |
| BL0(4) BL1(4) | BL0(5) BL1(5) | BL0(6) BL1(6) | x | x | x | x | o | o | o | x | x | x | x | x | x | x | x | x | x | o | x | x |
| BL0(5) BL1(5) | BL0(6) BL1(6) | BL0(7) BL1(7) | x | x | x | x | x | o | o | o | x | x | x | x | x | x | x | x | x | x | o | x |
| BL0(6) BL1(6) | BL0(7) BL1(7) | BL0(8) BL1(8) | x | x | x | x | x | x | o | o | o | x | x | x | x | x | x | x | x | x | x | o |
| BL0(7) BL1(7) | BL0(8) BL1(8) | BL0(9) BL1(9) | x | x | x | x | x | x | x | o | o | o | x | x | x | x | x | x | o | x | x | x |
| BL0(8) BL1(8) | BL0(9) BL1(9) | BL0(10) BL1(10) | x | x | x | x | x | x | x | x | o | o | o | x | x | x | x | x | x | o | x | x |
| BL0(9) BL1(9) | BL0(10) BL1(10) | BL0(11) BL1(11) | x | x | x | x | x | x | x | x | x | o | o | o | x | x | x | x | x | x | o | x |
| BL0(10) BL1(10) | BL0(11) BL1(11) | BL0(12) BL1(12) | x | x | x | x | x | x | x | x | x | x | o | o | o | x | x | x | x | x | x | o |
| BL0(11) BL1(11) | BL0(12) BL1(12) | BL0(13) BL1(13) | x | x | x | x | x | x | x | x | x | x | x | o | o | o | x | x | o | x | x | x |
| BL0(12) BL1(12) | BL0(13) BL1(13) | BL0(14) BL1(14) | x | x | x | x | x | x | x | x | x | x | x | x | o | o | o | x | x | o | x | x |
| BL0(13) BL1(13) | BL0(14) BL1(14) | BL0(15) BL1(15) | x | x | x | x | x | x | x | x | x | x | x | x | x | o | o | o | x | x | o | x |
| BL0(14) BL1(14) | BL0(15) BL1(15) | BL0(0) BLE_R | o | x | x | x | x | x | x | x | x | x | x | x | x | x | o | o | x | x | x | o | o ... open (conducting pass gate)
x ... close (non-conducting pass gate)

*FIG. 4b — Prior Art*

| Path to | | A(x) | | | | | | | | S(x) | | | | EL | ER | Path to | | | |
|---|---|---|---|---|---|---|---|---|---|---|---|---|---|---|---|---|---|---|---|
| V0 | V1 | 0 1 2 3 4 5 6 7 | | | | | | | | 0 1 2 3 | | | | | | DATA0L | DATA0R | DATA1L | DATA1R |
| BL0(0) | BL1(0) | o x x x x x x x | | | | | | | | o x x x | | | | Dm-1L | DmR | BLE_L | BL0(1) | BL0(15) | BL1(1) |
| BL0(1) | BL1(1) | o o x x x x x x | | | | | | | | x x x o | | | | DmL | DmR | BL0(0) | BL0(2) | BL1(0) | BL1(2) |
| BL0(2) | BL1(2) | o o o x x x x x | | | | | | | | x x o x | | | | DmL | DmR | BL0(1) | BL0(3) | BL1(1) | BL1(3) |
| BL0(3) | BL1(3) | x o o x x x x x | | | | | | | | x x x o | | | | DmL | DmR | BL0(2) | BL0(4) | BL1(2) | BL1(4) |
| BL0(4) | BL1(4) | x o o o x x x x | | | | | | | | x o x x | | | | DmL | DmR | BL0(3) | BL0(5) | BL1(3) | BL1(5) |
| BL0(5) | BL1(5) | x x o o x x x x | | | | | | | | x x x o | | | | DmL | DmR | BL0(4) | BL0(6) | BL1(4) | BL1(6) |
| BL0(6) | BL1(6) | x x o o o x x x | | | | | | | | x x o x | | | | DmL | DmR | BL0(5) | BL0(7) | BL1(5) | BL1(7) |
| BL0(7) | BL1(7) | x x x o o x x x | | | | | | | | x x x o | | | | DmL | DmR | BL0(6) | BL0(8) | BL1(6) | BL1(8) |
| BL0(8) | BL1(8) | x x x o o o x x | | | | | | | | o x x x | | | | DmL | DmR | BL0(7) | BL0(9) | BL1(7) | BL1(9) |
| BL0(9) | BL1(9) | x x x x o o x x | | | | | | | | x x x o | | | | DmL | DmR | BL0(8) | BL0(10) | BL1(8) | BL1(10) |
| BL0(10) | BL1(10) | x x x x o o o x | | | | | | | | x x o x | | | | DmL | DmR | BL0(9) | BL0(11) | BL1(9) | BL1(11) |
| BL0(11) | BL1(11) | x x x x x o o x | | | | | | | | x x x o | | | | DmL | DmR | BL0(10) | BL0(12) | BL1(10) | BL1(12) |
| BL0(12) | BL1(12) | x x x x x o o o | | | | | | | | x o x x | | | | DmL | DmR | BL0(11) | BL0(13) | BL1(11) | BL1(13) |
| BL0(13) | BL1(13) | x x x x x x o o | | | | | | | | x x x o | | | | DmL | DmR | BL0(12) | BL0(14) | BL1(12) | BL1(14) |
| BL0(14) | BL1(14) | x x x x x x x o | | | | | | | | x x o x | | | | DmL | DmR | BL0(13) | BL0(15) | BL1(13) | BL1(15) |
| BL0(15) | BL1(15) | o x x x x x x x | | | | | | | | x x x o | | | | DmL | Dm+1R | BL0(14) | BL1(0) | BL1(14) | BLE_R | o ... open (conducting pass gate)
x ... close (non-conducting pass gate)

FIG. 5b

| Path to | | A(x) | S(x) | S(x) | EL | ER | Path to | | | |
| --- | --- | --- | --- | --- | --- | --- | --- | --- | --- | --- |
| V0 | V1 | 0 1 2 3 | 0 1 2 3 | 0 1 2 3 | | | DATA0L | DATA0R | DATA1L | DATA1R |
| BL0(0) | BL1(0) | o x x x | o o o x | o x x x | Dm−1L | DmR | BLE_L | BL0(1) | BL0(15) | BL1(1) |
| BL0(1) | BL1(1) | o o x x | o o o x | x o x x | DmL | DmR | BL0(0) | BL0(2) | BL1(0) | BL1(2) |
| BL0(2) | BL1(2) | o o o x | o o o x | x x o x | DmL | DmR | BL0(1) | BL0(3) | BL1(1) | BL1(3) |
| BL0(3) | BL1(3) | x o o o | o o o x | x x x o | DmL | DmR | BL0(2) | BL0(4) | BL1(2) | BL1(4) |
| BL0(4) | BL1(4) | x o o o | o o x o | o x x x | DmL | DmR | BL0(3) | BL0(5) | BL1(3) | BL1(5) |
| BL0(5) | BL1(5) | x x o o | o o x o | x o x x | DmL | DmR | BL0(4) | BL0(6) | BL1(4) | BL1(6) |
| BL0(6) | BL1(6) | o x x o | o o x o | x x o x | DmL | DmR | BL0(5) | BL0(7) | BL1(5) | BL1(7) |
| BL0(7) | BL1(7) | o o x x | o o x o | x x x o | DmL | DmR | BL0(6) | BL0(8) | BL1(6) | BL1(8) |
| BL0(8) | BL1(8) | o o o x | o x o o | o x x x | DmL | DmR | BL0(7) | BL0(9) | BL1(7) | BL1(9) |
| BL0(9) | BL1(9) | o o o o | o x o o | x o x x | DmL | DmR | BL0(8) | BL0(10) | BL1(8) | BL1(10) |
| BL0(10) | BL1(10) | x o o o | o x o o | x x o x | DmL | DmR | BL0(9) | BL0(11) | BL1(9) | BL1(11) |
| BL0(11) | BL1(11) | x o o o | o x o o | x x x o | DmL | DmR | BL0(10) | BL0(12) | BL1(10) | BL1(12) |
| BL0(12) | BL1(12) | x x o o | x o o o | o x x x | DmL | DmR | BL0(11) | BL0(13) | BL1(11) | BL1(13) |
| BL0(13) | BL1(13) | x x x o | x o o o | x o x x | DmL | DmR | BL0(12) | BL0(14) | BL1(12) | BL1(14) |
| BL0(14) | BL1(14) | x x x o | x o o o | x x o x | DmL | DmR | BL0(13) | BL0(15) | BL1(13) | BL1(15) |
| BL0(15) | BL1(15) | o x x x | x o o o | x x x o | DmL | Dm+1R | BL0(14) | BL1(0) | BL1(14) | BLE_R | o ... open (conducting pass gate)
x ... close (non-conducting pass gate)

FIG. 6b

| Path to | | A(x) | S(x) | ER | Path to | | | |
|---|---|---|---|---|---|---|---|---|
| V0 | V1 | 0 1 2 3 4 5 6 7 | 0 1 2 3 | | DATA0L | DATA0R | DATA1L | DATA1R |
| BL0(0) | BL1(0) | o o x x x x x x | x x x x | DmR | BLE_L | BL0(1) | BL0(15) | BL1(1) |
| BL0(1) | BL1(1) | o o x x x x x x | o x x x | DmR | BL0(0) | BL0(2) | BL1(0) | BL1(2) |
| BL0(2) | BL1(2) | x x o o x x x x | x x x x | DmR | BL0(1) | BL0(3) | BL1(1) | BL1(3) |
| BL0(3) | BL1(3) | x x o o x x x x | o x x x | DmR | BL0(2) | BL0(4) | BL1(2) | BL1(4) |
| BL0(4) | BL1(4) | x x x x o o x x | x x o x | DmR | BL0(3) | BL0(5) | BL1(3) | BL1(5) |
| BL0(5) | BL1(5) | x x x x o o x x | x o x x | DmR | BL0(4) | BL0(6) | BL1(4) | BL1(6) |
| BL0(6) | BL1(6) | x x x x x x o o | x x o x | DmR | BL0(5) | BL0(7) | BL1(5) | BL1(7) |
| BL0(7) | BL1(7) | x x x x x x o o | x o x x | DmR | BL0(6) | BL0(8) | BL1(6) | BL1(8) |
| BL0(8) | BL1(8) | x x x x x x x x | x x x o | DmR | BL0(7) | BL0(9) | BL1(7) | BL1(9) |
| BL0(9) | BL1(9) | x x x x x x x x | x x o x | DmR | BL0(8) | BL0(10) | BL1(8) | BL1(10) |
| BL0(10) | BL1(10) | x x x x x x x x | x x x o | DmR | BL0(9) | BL0(11) | BL1(9) | BL1(11) |
| BL0(11) | BL1(11) | x x x x x x x x | x x o x | DmR | BL0(10) | BL0(12) | BL1(10) | BL1(12) |
| BL0(12) | BL1(12) | x x x x x x x x | o x x x | DmR | BL0(11) | BL0(13) | BL1(11) | BL1(13) |
| BL0(13) | BL1(13) | x x x x x x x x | x x x x | DmR | BL0(12) | BL0(14) | BL1(12) | BL1(14) |
| BL0(14) | BL1(14) | o x x x x x x x | x x x o | Dm+1R | BL0(13) | BL0(15) | BL1(13) | BL1(15) |
| BL0(15) | BL1(15) | o x x x x x x x | x x x x | Dm+1R | BL0(14) | BL1(0) | BL1(14) | BLE_R | o ... open (conducting pass gate)
x ... close (non-conducting pass gate)

FIG. 7b

| the number of bit lines per group | | 8 | 16 | 32 | 64 | 128 |
|---|---|---|---|---|---|---|
| two stages | (prior art) | 8 | 16 | 32 | 64 | 128 |
| | (invention) | 4 | 8 | 16 | 32 | 64 |
| three stages | (prior art) | NA | 16 | 24 | 32 | 48 |
| | (invention) | NA | 8 | 12 | 16 | 24 |
| four stages | (prior art) | NA | NA | 24 | 32 | 40 |
| | (invention) | NA | NA | 12 | 16 | 20 |

NA ... Not Applicable

*FIG. 7c*

DECODER CIRCUIT WITH FUNCTION OF PLURAL SERIES BIT LINE SELECTION

This application claims priority to U.S. Provisional Patent Application Ser. No. 60/424,773, filed on Nov. 8, 2002, which is herein incorporated by reference.

BACKGROUND OF THE INVENTION

1. Field of the Invention

The present invention generally relates to memory circuits. More particularly, this invention relates to a two-bit memory cell array addressing circuits with three to six series bit line selecting function.

2. Description of the Prior Art

A two-bit data stored memory cell is a special Metal Oxide Semiconductor (MOS) field effect transistor comprised of two storage areas under a gate. The MOS memory cell includes a source, a drain, and a gate. Various voltages are applied to the source, the drain and the gate to read the stored data in the storage, to program the cell, and to erase the cell. The drain and the source which consist of diffusion area are usually called as bit lines (BL's) because the stored bit data appears to the bit lines as a voltage or a current in read operation.

One of two-bit data stored memory cells is described in U.S. Pat. No. 6,248,633 (Ogura et al) directed toward a twin MONOS cell structure. The twin MONOS cell of which a schematic is shown in FIG. 1 includes two bit lines BL_l and BL_r and two nitride storage sites M_l and M_r under ultra short control gates CG_l and CG_r beside a word line gate WL. Another two-bit data stored memory cell is described in U.S. Pat. No. 6,011,725 (Eitan) directed toward a method of detecting and writing the content into one of two nitride storage site of a cell known well as NROM.

A simplified example of voltage conditions for the read operation in the twin MONOS cell is shown in FIG. 1. The bit line BL_r is connected to the ground (0V). A precharge voltage (1.8V in this example) is applied to the bit line BL_l. This makes the bit line BL_l floating. A word line voltage (1.8V), a select CG voltage (1.8V) and an override CG voltage (3.3V) are applied to WL, CG_r and CG_l, respectively, to turn on the memory cell transistor. Under these conditions, cell current flows from the bit line BL_l to the bit line BL_r through the memory cell transistor with magnitude of the current depending on charge stored in the storage site of right side M_r, and then the current affects the voltage of the bit line BL_l at a time. The bit line voltage is sensed and the bit data stored in the right side storage M_r is provided.

A prior art of simplified example voltage conditions for the program operation in the twin MONOS cell is shown in FIG. 2. The bit line BL_r is connected to a high voltage (5V). A program voltage (0V) or a program-inhibit voltage (1.8V) is applied to the other bit line BL_l. A word line voltage (1V), a select CG voltage (5V) and a override CG voltage (3.3V) are applied to WL, CG_r and CG_l, respectively, to turn on the memory cell transistor. When the bit line voltage of left side BL_l is the program voltage (0V), cell current flows, electrons accumulate in the right storage site M_r, and then the storage site is programmed. When the bit line voltage of left side BL_l is the program-inhibit voltage (1.8V), no cell current flows and the right storage site M_r maintains its erased condition.

In each operation, the voltage of the bit line in left side depends on the stored data in the right storage site or programmed data to the right storage site. Consequently, the bit line is hereinafter referred to as BL_data. In contrast, however, the voltage of the bit line in the right side is not changed by the sensed or programmed data. Because the bit line is coupled to another bit line of the adjacent memory cell in a memory array structure, the bit line is hereinafter referred to as BL_common. For example, in a read operation, 0V is applied to BL_common, and a voltage of BL_data is sensed. In program operation, voltages of BL_data and BL_common are 0V (or 1.8V) and 5V, respectively.

FIGS. 3(a) and (b) are memory array cross-sections of twin MONOS cells, which are disclosed in U.S. Pat. No. 6,248,633 (Ogura et al) and U.S. patent application Ser. No. 10/190634 (Ogura et al) "Twin MONOS array metal bit organization and single cell operation", respectively. When the memory is arrayed, the control gates above M_r and M_l of adjacent memory cells may be connected together in a stitch area such that the two nodes are schematically and functionally equivalent.

Two twin MONOS cells located in adjacent placement are accessed at the same time to select three series bit lines. For example, in FIG. 3a, a nitride storage site in right side of memory cell 54 and a nitride storage site in left side of memory cell 55 are read or programmed as follows. Bit line 64 which is shared with the selected memory cells 54 and 55 is selected as BL_common. Bit lines 63 and 65 which are bit lines in the opposite side of BL_common in the selected memory cells 54 and 55 are selected as BL_data in left and right sides, respectively. Bit line voltages for BL_common and BL_data are applied to the selected bit lines. Word line voltage, select CG voltage and override CG voltage are applied to word line 30, control gate 44 and control gate 43 and 45 in case of FIG. 3(a). In the case of FIG. 4(b), the selected CG voltage is higher, and the BL_data voltage is selected based on the input data.

Otherwise, for the memory array of FIG. 3(b), which denotes sample voltages during programming, memory cell selection is similar to that shown in FIG. 3(a).

There is an additional concern about the other BL's outside of BL_data and BL_common. These other BL's will be divided into two categories, BL_neighbor and BL_others. The BL_neighbor refers to the BL that is next to a BL_data, and that is not a BL_common. In order to prevent leakage, BL_neighbor's may be fixed to some intermediate voltage (1.8V for example), so that the voltage of BL_data is not compromised, especially during program or read. Note that this constraint to BL_neighbor is not required when BL_data is connected to the edge bit line of a memory array.

Some of sensing schemes require a reference voltage which is used to compare the voltage of BL_data. To process the comparison accurately, same noises in BL_data caused by word line coupling and CG line coupling should be provided to the node of the reference voltage. One of the ways to provide the noises to the reference node is to use an unused bit line as the reference node, and thus the neighboring bit line of left or right BL_neighbor can be used for the reference node. In case of no BL_neighbor, i.e. the memory array of FIG. 3(a), the neighboring bit line of left or right BL_data would be used. Consequently the bit line for the reference node is hereinafter referred to as BL_refer.

As described above, a pair of three to six series bit lines is selected, of which the number is determined by memory array structure and sensing scheme. In the case of a pair of three series bit lines selected, the order of the bit lines is left BL_data, BL_common and right BL_data from left to right. In the case of a pair of four series bit lines selected, the order of the bit lines is left BL_data, BL_common, right BL_data and BL_refer, or BL_refer, left BL_data, BL_common, and right BL_data from left to right. In the case of a pair of five series bit lines selected, the order of the bit lines is left BL_neighbor, left BL_data, BL_common, right BL_data and right BL_neighbor from left to right. In the case of a pair of six series bit lines selected, the order of the bit line's is left BL_neighbor, left BL_data, BL_common, right BL_data, right BL_neighbor and BL_refer, or BL_refer, left BL_neighbor, left BL_data, BL_common, right BL_data and right BL_neighbor from left to right. Note that these bit line combinations may be used beneficially in other memory arrays such as an array of NROM cells.

A bit line decoder provides connection of the bit line pair to circuit elements which apply or sense a voltage and provides disconnection of unselected bit lines of a plural of bit lines in a memory array to the circuit elements. A purpose of the present invention is to present a bit line decoder to support selection of a pair of three to six bit lines.

FIG. 4a shows a prior art of a bit line decoder 199 to connect a pair of three bit lines to circuit elements for BL_common and BL_data. The bit line decoder 199 includes two group circuits 299 and 399 of which each selects a pair of three series bit lines (BL_common and two BL_data) from 16 bit lines BLn[0]–BLn[15], applies a voltage to BL_common of the pair and sense a voltage of BL_data to output logic level signal of the sensing result or provide a voltage to BL_data based on input logic level signal, where n identifies the group number. The group circuit 299 in the 0th group includes bit lines BL0[0–15], pass transistors 240–255, 270–273, 280–283 and 290–293, intermediate nodes 220–223, a voltage node 230 for BL_common, and sense/driver circuit elements 235 and 236. The bit lines BL0[0]–BL0[15] in the memory array are connected to the first stage pass transistors 240–255, separately. A pass transistor may consist of an n-channel MOS transistor, or a p-channel MOS transistor or complementary MOS (CMOS) high voltage transistor pair, and the pass transistor controls connection of a bit line to an intermediate node by a control gate. Control gates of the pass transistors 240–255 are connected to control signals A[0]–A[15] separately, and every four pass transistors are connected together to one of four intermediate nodes 220–223. The intermediate nodes are connected to the last stage pass transistors 270–273, 280–-83 and 290–293 controlled by control signals S[0]–S[3], then the pass transistors 270–273 are connected to a node 230 to apply a voltage for BL_common from a common voltage node 190 and the pass transistors 280–283 and 290–293 are connected to nodes 231 and 232, respectively, which are terminals of left and right sense/driver circuit elements 235 and 236 (D0L and D0R), respectively. In read operation, the left and right sense/driver circuit elements 235 and 236 sense the voltage of the terminals 231 and 232, respectively, which are coupled to left and right BL_data, respectively, through the first and last stage pass transistors, and output logic level signals of the sensing results to nodes 233 and 234, respectively. In program operation, the sense/driver circuit elements 235 and 236 input logic level signals of programming data from the nodes 233 and 234, respectively, and provide voltages corresponding to the input signals to the terminals 231 and 232, respectively, which are coupled to left and right BL_data, respectively, through the first and last stage pass transistors. The same group circuit is repeated to the 1st group circuit 399 and more group circuits can be repeated.

The bit line decoder 199 further includes bit lines BLE_L, BLE_R, pass transistors 440, 455, 483 and 490, intermediate nodes 420 and 423, and sense/driver circuit elements 435 and 436. The bit lines BLE_L and BLE_R are connected to the first stage pass transistors 455 and 440 separately. Control gates of the pass transistors 455 and 440 are connected to control signals A[15] and A[0], respectively, and connected to intermediate nodes 423 and 420, respectively. The intermediate nodes 423 and 420 are connected to the last stage pass transistors 483 and 490, respectively, controlled by control signals S[0] and S[3], respectively, and the pass transistors 483 and 490 are connected to nodes 431 and 432, respectively, which are terminals of left and right sense/driver circuit elements 435 and 436 (DEL and DER), respectively, including nodes 433 and 434 for input/output logic level signal.

The table in FIG. 4b shows the operation of control signals A[0]–A[15] and S[0]–S[3]. Regarding of the control signals, actual "open" and "close" voltages of the control signal are dependent on the kind of a pass transistor. When an n-channel MOS transistor is used as the pass transistor, the control signal is active high, and high (~6V) and low (0V) voltages may be applied for "open" and "close" voltages, respectively. When a p-channel MOS transistor is used as the pass transistor, the control signal is active low, and low (~1V) and high (5V) voltages may be applied for "open" and "dose" voltages, respectively. When CMOS transistor set is used as the pass transistor, the control signal consists of two lines. And one of the lines is active high and the other is active low.

Regardless of the type of pass transistor, the voltage range of a control signal is wider than a logic voltage range for a digital logic circuit. (The logic voltage range is between 0V and 1.8V, although it depends on process technology.) Thus, a transistor for high voltage tolerance with thick gate oxide may be used in a driver of the control signal instead of using a transistor for logics. And a large driver consisting of the high voltage transistor is needed to drive the control signal of which capacitance is large because of a lot of connection of pass transistors gates. Since a high voltage transistor requires a large layout area due to process reason, the layout of the driver for the control signal becomes large. Moreover, a voltage level shifter circuit which changes the voltage of input high (or low) level to a higher (or lower) voltage and which uses a large layout area is required to exchange output of logic circuits to control signal voltage level. Then total layout area for control signal drivers becomes large because of the large number of control signals.

U.S. Pat. No. 6,248,633 (Ogura, et al.) describes a process for making and programming and operating a dual-bit multi-level ballistic MONOS memory. A fast low voltage ballistic program, ultra-short channel, high density, dual-bit multi-level flash memory is described with a two or three polysilicon split gate side wall process.

U.S. Pat. No. 6,011,725 (Eitan) describes a two bit non-volatile electrically erasable and programmable semiconductor memory cell utilizing asymmetrical charge trapping. The non-volatile electrically erasable programmable read only memory (EEPROM) is capable of storing two bits of information having a nonconducting charge trapping dielectric, such as silicon nitride, sandwiched between two silicon dioxide layers acting as electrical insulators.

U.S. Pat. No. 6,181,597 (Nachumovsky) describes a structure and method for implementing an EEPROM array using 2-bit non-volatile memory cells arranged in a plurality of rows and columns. A serial read operation is used in this structure and method.

U.S. Pat. No. 6,081,456 (Dadachev) describes bit line control circuit for a memory array using 2-bit non-volatile memory cells, where each memory cell has a first and a second charge trapping region. There are a set of bit lines extends between the array and the bit line control circuit.

SUMMARY OF THE INVENTION

It is therefore an object of the present invention to provide a circuit and a method of a decoder circuit to select three to six series bit lines from a plural bit lines. It is another objective of the present invention to provide a method and apparatus for selecting three to six series bit lines in a bit line decoder circuit by controlling signals of which the number is less than may be accomplished utilizing prior art circuitry and techniques. It is another objective of the present invention to provide a circuit and a method for edge bit line access by using extra control signals in the decoder circuit instead of in a switch after a sense/driver circuit element. It is another objective of the present invention to provide a circuit and a method with simpler logic of the control signals and with reduction of the number of sense/driver circuit elements by shifting labels of the bit lines. It is another objective of the present invention to provide a method and apparatus to apply a voltage for reduction of neighbor effect by using decoded charging transistors. It is another objective of the present invention to provide a method and apparatus to select a bit line for reference voltage located in left or right side of the center selected bit line.

The objects of this invention are achieved by a bit line decoding circuit for accessing an array of two-bit memory cells comprising a first stage containing pass gates whose first nodes are connected to sixteen bi-directional bit lines, whose second nodes are connected to bi-directional intermediate nodes, and whose third nodes are connected to first stage control signals wherein said control signals drive pairs of bits of said first stage pass gates, wherein said first stage control signals drive said pairs of pass gates which are associated with bit lines 0 and 1, 2 and 3, 4 and 5, 6 and 7, 8 and 9, 10 and 11, 12 and 13, and 14 and 15, a second stage containing pass gates whose first nodes are connected to said bi-directional bit intermediate nodes, whose second nodes are connected to bi-directional sense driver lines, and whose third nodes are connected to second stage control signals, and bi-directional sense/driver circuits whose first nodes are from said second stage and whose second nodes are connected to selection switches which select which sense/driver circuit is accessed for reading or programming said two-bit memory cells.

The above and other objects, features and advantages of the present invention will be better understood from the following detailed description taken in conjunction with the accompanying drawings.

BRIEF DESCRIPTION OF THE DRAWINGS

FIG. 1 illustrates a prior art of a twin MONOS cell schematic.

FIG. 2 illustrates prior arts of example voltage conditions for read and program operation in the twin MONOS cell.

FIG. 3*a* illustrates prior art of memory arrays using the twin MONOS cells.

FIG. 3*b* illustrates prior art of memory arrays using the twin MONOS cells.

FIG. 4*a* illustrates a prior art of a bit line decoder schematic selecting three series bit lines.

FIG. 4*b* presents a table which summarizes the pass gate logic of FIG. 4*a*.

FIG. 5*b* presents a table which summarizes the pass gate logic of FIG. 5*a*.

FIG. 6*b* presents a table which summarizes the pass gate logic of FIG. 6*a*.

FIG. 7*b* presents a table which summarizes the pass gate logic of FIG. 7*a*.

FIG. 7*c* contains a table which summarizes the number of control signals as a function of number of stages of pass gates and the number of bit lines per group.

DESCRIPTION OF THE PREFERRED EMBODIMENT

Figure 5A:
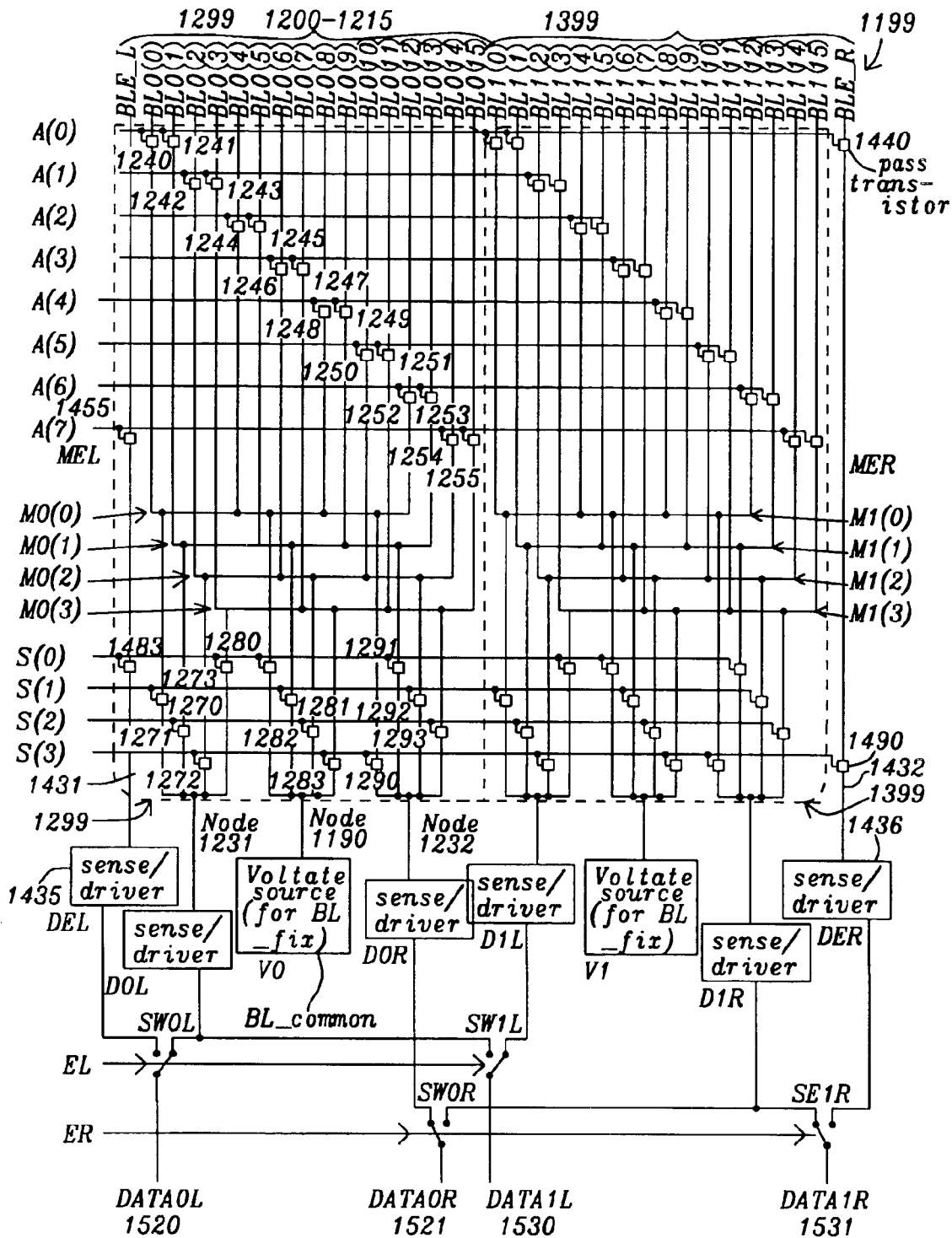
FIG. 5*a* illustrates a bit line decoder schematic selecting three series bit lines with "gate sharing" scheme of the first embodiment of the present invention.
Figure 6A:
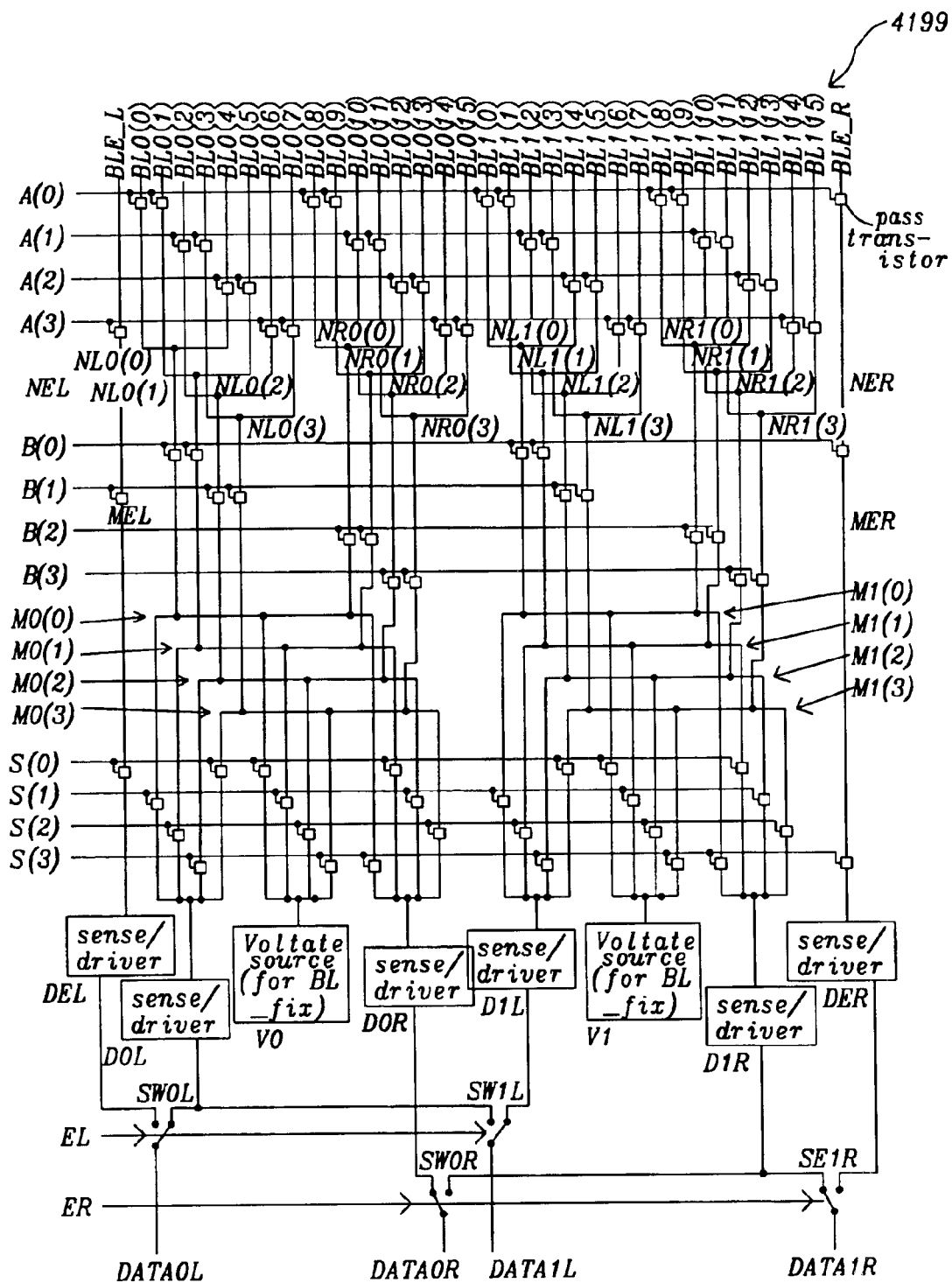
FIG. 6*a* illustrates a bit line decoder schematic selecting three series bit lines in 2 stages instead of 1 stage of the fourth embodiment of this invention.
Figure 7A:
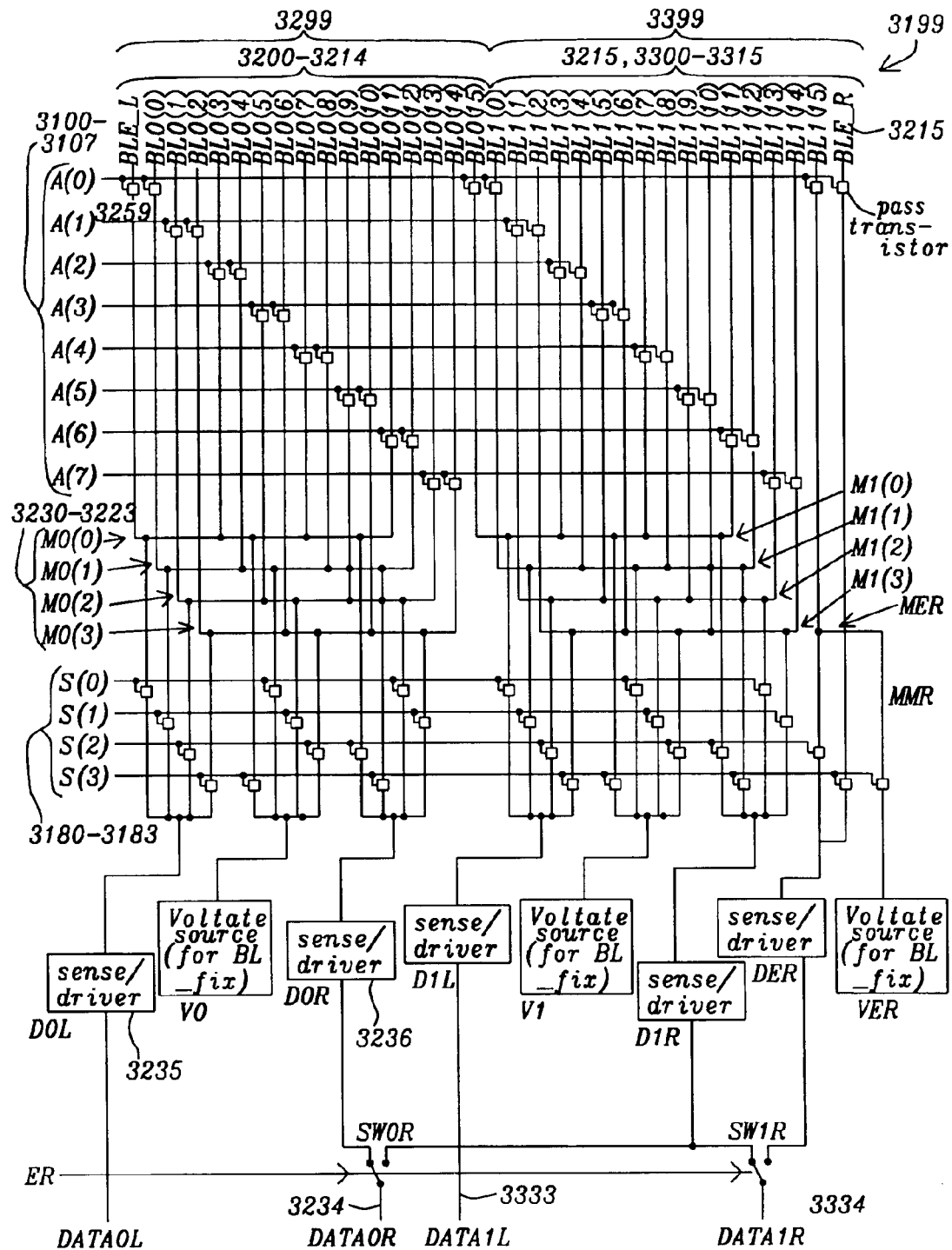
FIG. 7*a* illustrates a bit line decoder schematic selecting three series bit lines with "shifted bit line label" scheme of the third embodiment of the present invention.

There are five embodiments described below. The first embodiment is illustrated in FIG. 5*a*. The second and fifth embodiments are described in words with no figures shown. The third embodiment is shown in FIG. 7*a*. The fourth embodiment is shown in FIG. 6*a*.

FIG. 5*a* shows a bit line decoder schematic 1199 in accordance with the first embodiment of the present inventions, which connect a pair of three bit lines to nodes for BL-common and BL_data. As detailed later, control gates of two pass transistors in the first stage are connected together to a control signalin contrast to the prior art of the bit line decoder 199 shown in FIG. 2, and it helps reduction of the number of the control signals, hence this scheme of one of the present inventions is afterward referred to as the "gate sharing" scheme.

The bit line decoder 1199 includes two group circuits 1299 and 1399. Each group circuit includes 16 bit lines coupled to bit lines labeled as BLn[x] of n-th bit line label group in a memory array. Bit lines 1200–1215 in the 0th group circuit 1299 are coupled to bit lines labeled as BL0[0]–BL0[15], respectively, of 0th bit line label group. The bit lines 1200–1215 are connected to the first stage pass transistors 1240–1255, respectively. As described above, a pass transistor could consist of an n-channel MOS transistor, or a p-channel MOS transistor or a complementary MOS (CMOS or high voltage) transistor pair, and the pass transistor controls connection of a bit line to an intermediate node by a controlling gate. One set of control signals (A[0]–A[7]) is shared between control gates of two of the pass transistors 1240–1255. For example, control gates of the pass transistors 1240 and 1241 are connected to the control signal A[0], control gates of the pass transistors 1242 and 1243 are connected to the control signal A[1], and control gates of the pass transistors 1254 and 1255 are connected to the control signal A[7]. The drains of one in four pass transistors are connected together to one of four intermediate nodes M0[0]–M0[3]. For example, the pass transistors 1240, 1244, 1248 and 1252 are connected together to the intermediate node M0[0]. The intermediate nodes M0[0]–M0[3 are connected to the second or in this case last stage pass transistors 1270–1273, 1280–1283 and 1290–1293 controlled by control signals S[0]–S[3]. The pass transistors 1280–1283 coupled to another intermediate node which provide a voltage of BL_common from a common voltage node 1190 are connected to the intermediate nodes of the first stage, and are controlled by the control signals S[0]–S[3], respectively. The pass transistors 1270–1273 which receive or provide a voltage of BL_data to or from a terminal 1231 of a left sense/driver circuit element 1235 (D0L) are connected to the intermediate nodes M0[0]–M0[3], respectively, and are controlled by the control signals S[1], S[2], S[3], S[0], respectively. The pass transistors 1290–1293 which receive or provide a voltage of BL_data to or from a terminal 1232 of a right sense/driver circuit element 1236 (D0R) are connected to the intermediate nodes M0[0]–M0[3], respectively, and are controlled by the control signals S[3], S[0], S[1], S[2], respectively. This circuit group 1299 is copied to the first circuit group 1399 and can be repeated again along the memory array.

The bit line decoder 1199 further includes edge bit lines BLE_L and BLE_R. The bit line BLE_L and BLE_R are connected to the first stage pass transistors 1455 and 1440, respectively. Control gates of the pass transistors 1455 and 1440 are connected to the control signals A[7] and A[0], respectively. The pass transistors 1455 and 1440 are coupled to the last stage pass transistors 1483 and 1490, respectively, through intermediate nodes MEL and MER, respectively. The last stage pass transistors 1483 and 1490 which receive or provide a voltage of BL_data to or from a terminal 1431 and 1432, respectively, of a left and right sense/driver circuit elements 1435 and 1436, respectively, are controlled by the control signals S[0] and S[3], respectively.

The bit line decoder 1199 further includes data nodes 1520, 1521, 1530, 1531 (DATA0L, DATA0R, DATA1L, DATA1R) which are bidirectional logic level terminals for output of sensed data at a sense/driver circuit element in read operation and for input of program data to the sense/driver circuit element in program operation. The data nodes DATA0L, DATA0R, DATA1L, DATA1R are coupled to input/output terminals of the sense/driver circuit elements D0L, D0R, D1L, D1R, respectively, through switch circuits. In the case of access to the most left bit line detailed below with reference of the table in FIG. 5b, the switch circuits SW0L and SW0R are controlled by a select signal EL and change connection of data nodes DATA0L and DATA1L, respectively, from input/output terminals D0L and D1L, respectively, to input/output terminals 1433 and 1233, respectively, of the sense/driver circuit elements DEL and D0L, respectively. In the case of access to the most right bit line detailed below with reference of the table in FIG. 5b, the switch circuits SW0R and SW1R are controlled by a select signal ER and change connection of data nodes DATA0R and DATA1R, respectively, from input/output terminals DATA0R and DATA1R, respectively, to input/output terminals DATA0R and DATA1R, respectively, of the sense/driver circuit elements D1R and DER, respectively.

The number of control signals in the bit line decoder of the present invention is half of that in the prior bit line decoder without any additional transistors thanks to control signal connection to two control gates in a group circuit.

The table in FIG. 5b shows the operation of the control signals A[0]–A[7], S[0]–S[3] and select signals EL, ER for the bit line decoder 1199 illustrated in FIG. 5a. As described above, regarding of the control signals, actual "open" and "close" voltages of the control signal are dependent on the kind of a pass transistor. When an n-channel MOS transistor is used as the pass transistor, the control signal is active high, and high (~6V) and low (0V) voltages may be applied for "open" and "close" voltages, respectively. When a p-channel MOS transistor is used as the pass transistor, the control signal is active low, and low (~−1V) and high (5V) voltages may be applied for "open" and "close" voltages, respectively. When CMOS transistor set is used as the pass transistor, the control signal consists of two lines. And one of the lines is active high and the other is active low.

Voltage paths are described below. For further illustration, when BL0[4] and BL1[4] are selected as BL_common, control signals A[1], A[2] and S[0] open pass transistors connected to them, and select signals EL and ER make connection between DATA0L and D0L, DATA0R and D0R, DATA1L and D1L, and DATA1R and D1R. Then a BL_common voltage is provided from a common voltage node 1190 to BL0[4] and BL1[4] through the last stage pass transistors 1270 and 1370, respectively, and through the first stage pass transistors 1244 and 1344, respectively. Bit lines BL0[3], BL0[5], BL1[3] and BL1[5] in both sides adjacent the bit lines BL0[4] and BL1[4] selected as BL_common are connected to DATA0L, DATA0R, DATA1L and DATA1R, respectively, through the last stage pass transistors 1283, 1291, 1383 and 1391, respectively, and through the first stage pass transistors 1243, 1245, 1343 and 1345, respectively.

As shown in the table of FIG. 5b, two control signals A[x] and A[x+1] (or A[7] and A[0]) make pass transistors open at the same time. Hence four bit lines are connected to four intermediate nodes. Three of the four intermediate nodes are connected to a node of BL_common and sense/driver circuit elements, thus one intermediate node is unconnected and floating. Care must be taken of the voltage in the floating intermediate node before change of address decoded. If a voltage is applied to the intermediate node by a BL_common voltage node or a sense/driver circuit element in the previous mode, the charge left in the intermediate node might not be discharged because it's a floating node. At the next address, the charge in the intermediate node which is floating at the previous address is spread to a bit line and increases a voltage of the bit line. The voltage change of the bit line may make disturb or weak program voltage condition in memory array. To avoid the unwanted condition, the BL_common voltage node or the sense/driver circuit element could provide 0V to all intermediate nodes with open of appropriate pass transistors before access to the next address.

A bit line decoder schematic is described in accordance with a second embodiment (no figure shown) of the present invention, which connect a pair of three bit lines to nodes for BL_common and BL_data. As detailed later, control signals for edge bit line control are added into the first stage pass transistors in contrast to the bit line decoder 1199 shown in FIG. 5a, and it helps to eliminate the two sense/driver circuit elements (1435 and 1446 in FIG. 5a) for edge bit line access which require a large layout area, hence this scheme of one of the present inventions is afterward referred to as the "extra control signal" scheme.

The second embodiment bit line decoder includes two group circuits. Each group circuit includes 18 bit lines of whichb 16 bit lines in the center are coupled to bit lines labeled as BLn[x] of n-th bit line label group in a memory array, and of which each of left and right side bit lines comes from an edge bit line in a memory array or a most left or right edge bit line in the adjacent group. The 16 bit lines in the 0th group circuit are coupled to bit lines labeled as BL0[0]–BL0[15], respectively, of 0th bit line label group, and the left and right side bit lines are coupled to the left edge bit line BLE_L in the memory array and a bit line labeled as BL1[0] in the most left side of the 1st bit line label group, respectively. The 16 bit lines are connected to the 16 first stage pass transistors, respectively. One of control signals (A[0]–A[7]) is shared between control gates of two of the pass transistors as same as the connection in the bit line decoder 1199 shown in FIG. 5a, and control gates of the pass transistors and for the side bit lines, respectively, are connected to extra control signals (A[−1] and A[8]), respectively. Every four pass transistors are connected together to one of four intermediate nodes (M0[1]–M0[3]). For example, the pass transistors are connected together to the intermediate node (M0[0]). The intermediate nodes are connected to the last stage pass transistors controlled by control signals (S[0]–S[3]). The pass transistors coupled to a node which provide a voltage of BL_common from a common voltage node are connected to the intermediate nodes (M0[0]–M0[3]), respectively, and are controlled by the control signals (S[3], S[0]–S[2]), respectively. The pass transistors which receive or provide a voltage of BL_data to or from a terminal of a left sense/driver circuit element (D0L) are connected to the intermediate nodes (M0[0]–M0[3]), respectively, and are controlled by the control signals (S[0]–S[3]), respectively. The pass transistors which receive or provide a voltage of BL_data to or from a terminal of a right sense/driver circuit element (D0R) are connected to the intermediate nodes (M0[0]–M0[3]), respectively, are controlled by the control signals (S[2], S[3], S[0], S[1]), respectively. Each sense/driver circuit element has an input/output terminal to output logic level signal based on sensed BL_data voltage in read operation or to input logic level signal for providing BL_data voltage in program operation. The left and right sense/driver circuit elements (D0L and D0R) includes input/output terminals, respectively, coupled to data nodes DATA0L and DATA0R, respectively.

The same group circuit is copied to the 1st group circuit where left and right side bit lines are coupled to the most right bit line in the left adjacent group (0th group) and the right edge bit line BLE_R in the memory array, respectively, and where input/output terminals are coupled with data nodes DATA1L and DATA1R, respectively.

FIG. 7a shows a bit line decoder schematic 3199 in accordance with a third embodiment of the present invention, which connect a pair of three bit lines to nodes for BL_common and BL_data. As detailed later, labels of bit lines are shifted to right direction of one bit line in contrast to the bit line decoder 4199 shown in FIG. 6a, and it helps simplifying logic of the control signals, as well as elimination of one control signal (A[−1]) (in other words, reduction of layout area for the control signal driver), hence this scheme of one of the present inventions is afterward referred to as the "shifted bit line label" scheme.

The bit line decoder 3199 includes two group circuits 3299 and 3399. Each group circuit includes 18 bit lines, of which the 16 bit lines in the center are coupled to bit lines labeled as BLn[0]–BLn[15] of n-th bit line label group in a memory array, of which the most left side bit line comes from an left edge bit line in the memory array or the second right side bit line BLn−1[14] in the left adjacent group, and of which the rest bit line in most right side comes from an right edge bit line in the memory array or the most left side bit line BLn+1[0] in the right adjacent group. Bit lines 3200–3214 in the 0th group circuit 3299 are coupled to bit lines labeled as BL0[0]–BL0[14], respectively, of 0th bit line label group, the left side bit line 3215 is coupled with the left edge bit line BLE_L in the memory array, and the right side bit lines 3315 and 3300 are coupled to a bit line labeled as BL0[15] in the most right side of the 0th bit line label group and a bit line labeled as BL1[0] in the most left side of the 1st bit line label group, respectively. The bit lines 3215, 3200–3214, 3315 and 3300 are connected to the first stage pass transistors 3259, 3240–3256, respectively. One of control signals 3100–3108 (A[0]–A[8]) is shared between control gates of two of the pass transistors 3259, 3240–3256, in which pass transistors for edge bit line connection are included in contrast to the bit line decoder shown in FIG. 6a. For example, control gates of the pass transistors 3259 and 3240 are connected to the control signal 3100 (A[0]), control gates of the pass transistors 3241 and 3242 are connected to the control signal 3101 (A[1]), and control gates of the pass transistors 3255 and 3256 are connected to the control signal 3108 (A[8]). Every four pass transistors are connected together to one of four intermediate nodes 3220–3223 (M0[0]–M0[3]). For example, the pass transistors 3259, 3243, 3247, 3251 and 3255 are connected together to the intermediate node 3220 (M0[0]). The rest connection among the intermediate nodes 3220–3223, last stage pass transistors 3270–3273, 3280–3283, 3290–3293, control signals 3180–3183 (S[0]–S[3]), a common voltage node 3190 for BL_common, sense/driver circuit elements 3235 and 3236 (D0L and D0R), and data nodes DATA0L and DATA0R in the 0th group circuit are the same as those of the bit line decoder shown in FIG. 6a. The intermediate nodes 3220–3223 are connected to the last stage pass transistors 3270–3273, 3280–3283 and 3290–3293 controlled by control signals 3180–3183 (S[0]–S[3]). The pass transistors 3270–3273 coupled to a node 3230 which provide a voltage of BL_common from a common voltage node 3190 are connected to the intermediate nodes 3220–3223 (M0[0]–M0[3]), respectively, and are controlled by the control signals 3183, 3180–3182 (S[3], S[0]–S[2]), respectively. The pass transistors 3280–3283 which receive or provide a voltage of BL_data to or from a terminal 3231 of a left sense/driver circuit element 3235 (D0L) are connected to the intermediate nodes 3220–3223 (M0[0]–M0[3]), respectively, and are controlled by the control signals 3180–3183 (S[0]–S[3]), respectively. The pass transistors 3290–3293 which receive or provide a voltage of BL_data to or from a terminal 3232 of a right sense/driver circuit element 3236 (D0R) are connected to the intermediate nodes 3220–3223 (M0[0]–M0[3]), respectively, are controlled by the control signals 3182, 3183, 3180, 3181 (S[2], S[3], S[0], S[1]), respectively. Each sense/driver circuit element has an input/output terminal to output logic level signal based on sensed BL_data voltage in read operation or to input logic level signal for providing BL_data voltage in program operation. The left and right sense/driver circuit elements 3235 and 3236 (D0L and D0R) includes input/output terminals 3233 and 3234, respectively, coupled to data nodes DATA0L and DATA0R, respectively. The same group circuit is copied to the 1st group circuit 3399 where left and right side bit lines are coupled to the second right bit line 3215 in the left adjacent group (0th group 3299) and the right edge bit line BLE_R in the memory array, respectively, and where input/output terminals 3333 and 3334 are coupled with data nodes DATA1L and DATA1R, respectively.

Finally, in FIG. 7a, it can be seen that by "shifting back" the pairing of the transistors, such that 1240, 1241 corresponds with BLE_L and BL0[0] instead of BL[0] and BL[1] in FIG. 5a, decoding of the control gate signals A[0–7] can be simplified.

The table in FIG. 7b shows the operation of the control signals 3100–3108 (A[0]–A[8]) and 3180–3183 (S[0]–S[3]) for the bit line decoder 3199 illustrated in FIG. 7a. In respect with logic of control signals A[0]–A[8], every control signal can be categorized by quotient of the bit line number selected as BL_common divided by 2. For example, when BLn[4] or BLn[5] is selected as BL_common in which the quotients of "4" and "5" divided by 2 are the same and where n is the group number (n=0, 1), A[2] is an open signal in both cases. Generally, address information to select a bit line as BL_common is given and represented as a binary number. A quotient of a binary number divided by 2 is given simply by eliminating the least significant bit (LSB, bit 0) of the binary number. Thus, the rest of address binary number without LSB is used to make logic table of control signal A[x] for the bit line decoder shown in FIG. 7, while LSB is necessary to make logic table of control signal A[x] for the bit line decoder shown in FIG. 5a and FIG. 6a.

All schemes of "gate sharing", "extra control signal" and "shifted bit line label" described above can also be used in a bit line decoder with two or more stage pass transistor architecture. The table in FIG. 7c shows the the number of control signals excluding control signals for the last stage pass transistors which depends on the number of stages, the number of bit lines in a group and the kind of schemes. In any cases, the number of control signals using the present innovative schemes are less than that of prior art of a bit line decoder.

FIG. 6a shows a schematic for the fourth embodiment of this invention. It is a two-stage bit line decoder 4199. Two pairs of control signals A[0]–A[4] and B[0]–B[3] operate connection between a bit line and an intermediate node in the bit line decoder, whereas a single set of control signals A[0]–A[8] operates the connection in the bit line decoder shown of FIG. 5a.

It is also possible to apply this 2-stage approach to decode other multiples of BL's and/or CG's besides the 16 that was used for this example. The advantage of the 2 stage approach is that the number of control gate signals will decrease. But the series resistance through the additional pass gates increases.

The table in FIG. 6b shows the open and closed state of the pass gates for the embodiment of FIG. 6a.

In a fifth embodiment (no figure shown) of this invention, five bit lines are connected to to nodes for BL_common, BL_data and BL_neighbor. As detailed later, charging transistors controlled by decoded control signals provide a voltage for BL_neighbor to appropriate bit lines, hence this scheme of one of the present inventions is afterward referred to as the "decoded charging transistor" scheme.

The fifth embodiment bit line decoder includes two group circuits. Each group circuit includes 18 bit lines, of which the 16 bit lines in the center are coupled to bit lines labeled as BLn[0]–BLn[15] of n-th bit line label group in a memory array, of which the most left side bit line comes from an left edge bit line in the memory array or the second right side bit line BLn−1 [14] in the left adjacent group, and of which the rest bit line in most right side comes from an right edge bit line in the memory array or the most left side bit line BLn+1[0] in the right adjacent group. Bit lines in the 0th group circuit are coupled to bit lines labeled as BL0[0]–BL0[14], respectively, of 0th bit line label group, the left side bit line is coupled with the left edge bit line BLE_L in the memory array, and the right side bit lines are coupled to a bit line labeled as BL0[15] in the most right side of the 0th bit line label group and a bit line labeled as BL1[0] in the most left side of the 1st bit line label group, respectively. The 16 bit lines in the left side of the 18 bit lines are connected to charging transistors (pass transistors), which provide a voltage of BL_neighbor from a common voltage node and of which every four control gates are connected together to control signals (P[1]–P[3], P[0]), respectively.

For example, a control gate of a charging transistor connected to a bit line is coupled to a control signal (P[1]), a control gate of a charging transistor connected to a bit line is coupled to a control signal (P[2]), and a control gate of a charging transistor connected to a bit line is coupled to a control signal (P[0]). The rest connection among the bit lines, first stage pass transistors, control signals (A[0]–A[8]), intermediate nodes, last stage pass transistors, control signals (S[0]–S[3]), a common voltage node for BL_common, sense/driver circuit elements (D0L and D0R), and data nodes DATA0L and DATA0R in the 0th group circuit are the same as those of the bit line decoder shown in FIG. 7a. The bit lines are connected to the first stage pass transistors, respectively. One of control signals (A[0]–A[8]) is shared between control gates of two of the pass transistors, in which pass transistors for edge bit line connection are included in contrast to the bit line decoder shown in FIG. 6a. For example, control gates of the pass transistors are connected to the control signal (A[0]), control gates of the pass transistors are connected to the control signal (A[1]), and control gates of the pass transistors are connected to the control signal (A[8]). Every four pass transistors are connected together to one of four intermediate nodes (M0[0]–M0[3]). For example, the pass transistors are connected together to the intermediate node (M0[0]). The intermediate nodes are connected to the last stage pass transistors controlled by control signals (S[02]–S[3]). The pass transistors coupled to a node which provide a voltage of BL_common from a common voltage node are connected to the intermediate nodes (M0[0]–M0[3]), respectively, and are controlled by the control signals (S[3], S[0]–S[2]), respectively. The pass transistors which receive or provide a voltage of BL_data to or from a terminal of a left sense/driver circuit element (D0L) are connected to the intermediate nodes (M0[0]–M0[3]), respectively, and are controlled by the control signals (S[0]–S[3]), respectively. The pass transistors which receive or provide a voltage of BL_data to or from a terminal of a right sense/driver circuit element (D0R) are connected to the intermediate nodes (M0[0]–M0[3]), respectively, are controlled by the control signals (S[2], S[3], S[0], S[1]), respectively. Each sense/driver circuit element has an input/output terminal to output logic level signal based on sensed BL_data voltage in read operation or to input logic level signal for providing BL_data voltage in program operation. The left and right sense/driver circuit elements (D0L and D0R) includes input/output terminals, respectively, coupled to data nodes DATA0L and DATA0R, respectively.

The same group circuit is copied to the 1 st group circuit where left and right side bit lines are coupled to the second right bit line in the left adjacent group (0th group) and the right edge bit line BLE_R in the memory array, respectively, and where input/output terminals are coupled with data nodes DATA1L and DATA1R, respectively.

Two right edge bit lines labeled as BL1[15] and BLE_R, respectively, are also connected to charging transistors, respectively, which provide a voltage of BL_neighbor from a common voltage node and of which control gates are connected to control signals, (P[1] and P[2]), respectively.

In accordance with the fifth embodiment of the present invention, a bit line decoder connects a pair of four bit lines to nodes for BL_common, BL_data and BL_refer. As detailed later, a set of pass transistors for BL_refer is placed in the last stage pass transistors, hence this scheme of one of the present inventions is afterward referred to as the "reference pass transistor" scheme. The bit line decoder can be the same as that shown in FIG. 5a except for the addition of the reference pass transistors.

The bit line decoder includes two group circuits and. Each group circuit includes 18 bit lines, of which the 16 bit lines in the center are coupled to bit lines labeled as BLn[0]BLn[15] of n-th bit line label group in a memory array, of which the most left side bit line comes from an left edge bit line in the memory array or the second right side bit line BLn−1[14] in the left adjacent group, and of which the rest bit line in most right side comes from an right edge bit line in the memory array or the most left side bit line BLn+1[0] in the right adjacent group. Bit lines in the 0th group circuit are coupled to bit lines labeled as BL0[0]–BL0[14], respectively, of 0th bit line label group, the left side bit line is coupled with the left edge bit line BLE_L in the memory array, and the right side bit lines are coupled to a bit line labeled as BL0[15] in the most right side of the 0th bit line label group and a bit line labeled as BL1[0] in the most left side of the 1st bit line label group, respectively. The bit lines are connected to the first stage pass transistors, respectively. One of control signals (A[0]–A[8]) is shared between control gates of: two of the pass transistors, in which pass transistors for edge bit line connection are included in contrast to the bit line decoder shown in FIG. 6a. For example, control gates of the pass transistors are connected to the control signal (A[0]), control gates of the pass transistors are connected to the control signal (A[1]), and control gates of the pass transistors are connected to the control signal (A[8]). Every four pass transistors are connected together to one of four intermediate nodes (M0[0]–M0[3]). For example, the pass transistors are connected together to the intermediate node (M0[0]). The intermediate nodes are connected to the last stage pass transistors controlled by control signals (S[0]–S[3]). The pass transistors coupled to a node which provide a voltage of BL_common from a common voltage node are connected to the intermediate nodes (M0[0]–M0[3]), respectively, and are controlled by the control signals (S[3], S[0]–S[2]), respectively. The pass transistors which receive or provide a voltage of BL_data to or from a terminal of a left sense/driver circuit element (D0L) are connected to the intermediate nodes (M0[0]–M0[3]), respectively, and are controlled by the control signals (S[0]–S[3]), respectively. The pass transistors which receive or provide a voltage of BL_data to or from a terminal of a right sense/driver circuit element (D0R) are connected to the intermediate nodes (M0[0]–M0[3]), respectively, are controlled by the control signals (S[2], S[3], S[0], S[1]), respectively. The pass transistors which transfer a voltage of BL_refer to a reference voltage terminal in both sense/driver circuit elements (D0R and D0L) are connected to the intermediate nodes (M0[0]–M0[3]), respectively, are controlled by the control signals (S[1]–S[3], S[0]), respectively. Each sense/driver circuit element has an input/output terminal to output logic level signal based on sensed BL_data voltage in read operation or to input logic level signal for providing BL_data voltage in program operation. The left and right sense/driver circuit elements (D0L; and D0R) includes input/output terminals, respectively, coupled to data nodes DATA0L and DATA0R, respectively.

The same group circuit is copied to the 1st group circuit where left and right side bit lines are coupled to the second right bit line in the left adjacent group (0th group) and the right edge bit line BLE_R in the memory array, respectively, and where input/output terminals are coupled with data nodes DATA1L and DATA1R, respectively.

Although the invention has been described in connection with several embodiments, it is understood that this invention is not limited to the embodiments disclosed, but is capable of various modifications which would be apparent to a person skilled in the art. For example, although a group circuit in each bit line decoder has been described s having 16 (and two extra) bit lines, it is understood that a group circuit having different numbers of bit lines can be constructed.

The main advantage of the bit line decoding circuit of this invention is to reduce the number of control signals and corresponding devices needed. These control signals and devices consume substantial semiconductor area. Another advantage of this invention is to provide a circuit and a method with fewer sense/driver circuits by shifting the bit lines in the bit line decoder. Another advantage of this invention is to use a few extra control signals in the decode section in order to reduce the number of sense line switches required. Another advantage is the ability to apply voltages to parts of the decoder circuit in order to reduce the neighbor effect. This is done by using decoded charging transistors.

While the invention has been described in terms of the preferred embodiments, those skilled in the art will recognize that various changes in form and details may be made without departing from the spirit and scope of the invention.

What is claimed is:

1. A bit line decoding circuit for accessing an array of two-bit memory cells comprising,
    a first stage containing pass gates whose first nodes are connected to sixteen bi-directional bit lines, whose second nodes are connected to bi-directional intermediate nodes, and whose third nodes are connected to first stage control signals wherein said control signals drive pairs of bits of said first stage pass gates, wherein said first stage control signals drive said pairs of pass gates which are associated with bit lines 0 and 1, 2 and 3, 4 and 5, 6 and 7, 8 and 9, 10 and 11, 12 and 13, and 14 and 15,
    a second stage containing pass gates whose first nodes are connected to said bi-directional bit intermediate nodes, whose second nodes are connected to bi-directional sense driver lines, and whose third nodes are connected to second stage control signals, and
    bi-directional sense/driver circuits whose first nodes are from said second stage and whose second nodes are connected to selection switches which select which sense/driver circuit is accessed for reading or programming said two-bit memory cells.

2. The bit line decoding circuit of claim 1 where in said first stage pass gates are comprised of N metal oxide semiconductor NMOS or P metal oxide semiconductor PMOS field effect transistors FETs whose drains are connected to said bi-directional bit lines, whose sources are connected to said bi-directional intermediate nodes and whose gates are connected to said first stage control signals.

3. The bit line decoding circuit of claim 1 wherein every fourth bit of said sixteen bi-directional intermediate nodes are connected together to form four separate intermediate junction nodes.

4. The bit line decoding circuit of claim 3 wherein said second stage pass gates are comprised of NMOS or PMOS FETs whose drains are connected to said intermediate junction nodes, whose every four sources are connected together to form bi-directional sense/driver nodes which connect to said bi-directional sense/driver circuits, and whose gates are connected to said second stage control signals.

5. The bit line decoding circuit of claim 4 wherein said first group of said four sources which are connected in common are connected to a bi-directional sense/driver circuit which drives the bit line left data of said two-bit memory cells.

6. The bit line decoding circuit of claim 4 wherein said second group of said four sources which are connected in common are connected to a bi-directional sense/driver circuit which drives the bit line common data of said two-bit memory cells.

7. The bit line decoding circuit of claim 4 wherein said third group of said four sources which are connected in common are connected to a bi-directional sense/driver circuit which drives the bit line right data of said two-bit memory cells.

8. The bit line decoding circuit of claim 1 wherein said bit line left data bi-directional sense/driver signal is combined as input to a selection switch with a bi-directional sense/driver left edge line wherein an edge left control signal's one or zero logic level selects between said two switch inputs.

9. The bit line decoding circuit of claim 1 wherein said bit line left data bi-directional sense/driver signal is combined as input to a selection switch with a bit line left data bi-directional sense/driver from an adjacent group of sixteen bit lines wherein said edge left control signal's one or zero logic level selects between said two switch inputs.

10. The bit line decoding circuit of claim 1 wherein said bit line right data bi-directional sense/driver signal is combined as input to a selection switch with a bi-directional sense/driver right edge line wherein an edge right control signal's one or zero logic level selects between said two switch inputs.

11. The bit line decoding circuit of claim 1 wherein said bit line right data bi-directional sense/driver signal is combined as input to a selection switch with a bit line right data bi-directional sense/driver from an adjacent group of sixteen bit lines wherein said edge right control signal's one or zero logic level selects between said two switch inputs.

12. A bit line decoding circuit for accessing an array of two-bit memory cells comprising,
- a first stage containing pass gates whose first nodes are connected to sixteen bi-directional bit lines, whose second nodes are connected to a first set of: bi-directional intermediate nodes, and whose third nodes are connected to first stage control signals wherein said control signals drive two pairs of bits of said first stage pass gates, wherein said first stage control signals drive said pairs of pass gates which are associated with bit lines 0 and 1, 2 and 3, 4 and 5, 6 and 7, 8 and 9, 10 and 11, 12 and 13, and 14 and 15,
- a second stage containing pass gates whose first nodes are connected to said first set of bi-directional intermediate nodes, whose second nodes are connected to a second set of bi-directional intermediate nodes, and whose third nodes are connected to second stage control signals, wherein said control signals drive four or more bits of said second stage pass gates,
- a third stage containing pass gates whose first nodes are connected to said second set of bi-directional bit intermediate nodes, whose second nodes are connected to bi-directional sense driver lines, and whose third nodes are connected to third stage control signals, and
- bi-directional sense/driver circuits whose first nodes are from said second stage and whose second nodes are connected to selection switches which select which sense/driver circuit is accessed for reading or programming said two-bit memory cells.

13. The bit line decoding circuit of claim 12 where in said first stage pass gates are comprised of N metal oxide semiconductor NMOS or P metal oxide semiconductor PMOS field effect transistors FETs whose drains are connected to said bi-directional bit lines, whose sources are connected to said bi-directional intermediate nodes and whose gates are connected to said first stage control signals.

14. The bit line decoding circuit of claim 12 where in said second stage pass gates are comprised of N metal oxide semiconductor NMOS or P metal oxide semiconductor PMOS field effect transistors FETs whose drains are connected to said first set of bi-directional intermediate nodes, whose sources are connected to said second set of bi-directional intermediate nodes and whose gates are connected to said second stage control signals.

15. The bit line decoding circuit of claim 12 wherein every fourth bit of said sixteen bi-directional intermediate nodes are connected together to form four separate intermediate junction nodes.

16. The bit line decoding circuit of claim 15 wherein said second stage pass gates are comprised of NMOS or PMOS FETs whose drains are connected to said intermediate junction nodes, whose every four sources are connected together to form bi-directional sense/driver nodes which connect to said bi-directional sense/driver circuits, and whose gates are connected to said second stage control signals.

17. The bit line decoding circuit of claim 16 wherein said first group of said four sources which are connected in common are connected to a bi-directional sense/driver circuit which drives the bit line left data of said two-bit memory cells.

18. The bit line decoding circuit of claim 16 wherein said second group of said four sources which are connected in common are connected to a bi-directional sense/driver circuit which drives the bit line common data of said two-bit memory cells.

19. The bit line decoding circuit of claim 16 wherein said third group of said four sources which are connected in common are connected to a bidirectional sense/driver circuit which drives the bit line right data of said two-bit memory cells.

20. The bit line decoding circuit of claim 12 wherein said bit line left data bidirectional sense/driver signal is combined as input to a selection switch with a bidirectional sense/driver left edge line wherein an edge left control signal's one or zero logic level selects between said two switch inputs.

21. The bit line decoding circuit of claim 12 wherein said bit line left data bi-directional sense/driver signal is combined as input to a selection switch with a bit line left data bidirectional sense/driver from an adjacent group of sixteen bit lines wherein said edge left control signal's one or zero logic level selects between said two switch inputs.

22. The bit line decoding circuit of claim 12 wherein said bit line right data bidirectional sense/driver signal is combined as input to a selection switch with a bidirectional sense/driver right edge line wherein an edge right control signal's one or zero logic level selects between said two switch inputs.

23. The bit line decoding circuit of claim 12 wherein said bit line right data bidirectional sense/driver signal is combined as input to a selection switch with a bit line right data bidirectional sense/driver from an adjacent group of sixteen bit lines wherein said edge right control signal's one or zero logic level selects between said two switch inputs.

24. A bit line decoding circuit for accessing an array of two-bit memory cells comprising, a first stage containing pass gates whose first nodes are connected to sixteen bidirectional bit lines, whose second nodes are connected to bidirectional intermediate nodes, and whose third nodes are connected to first stage control signals wherein said control signals drive pairs of bits of said first stage pass gates, wherein said first stage control signals drive said pairs of pass gates which are associated with bit lines 1 and 2, 3 and 4, 5 and 6, 7 and 8, 9 and 10, 11 and 12, 13 and 14, and 15 and 0 (of next group of 16 bit lines), a second stage containing pass gates whose first nodes are connected to said bidirectional bit intermediate nodes, whose second nodes are connected to bidirectional sense driver lines, and whose third nodes are connected to second stage control signals, and bidirectional sense/driver circuits whose first nodes are from said second stage and whose second nodes are connected to selection switches which select which sense/driver circuit is accessed for reading or programming said two-bit memory cells.

25. The bit line decoding circuit of claim 24 where in said first stage pass gates are comprised of N metal oxide semiconductor NMOS or P metal oxide semiconductor PMOS field effect transistors FETs whose drains are connected to said bidirectional bit lines, whose sources are connected to said bidirectional intermediate nodes and whose gates are connected to said first stage control signals.

26. The bit line decoding circuit of claim 24 wherein every fourth bit of said sixteen bidirectional intermediate nodes are connected together to form four separate intermediate junction nodes.

27. The bit line decoding circuit of claim 26 wherein said second stage pass gates are comprised of NMOS or PMOS FETs whose drains are connected to said intermediate junction nodes, whose every four sources are connected together to form bidirectional sense/driver nodes which connect to said bidirectional sense/driver circuits, and whose gates are connected to said second stage control signals.

28. The bit line decoding circuit of claim 27 wherein said first group of said four sources which are connected in common are connected to a bidirectional sense/driver circuit which drives the bit line left data of said two-bit memory cells.

29. The bit line decoding circuit of claim 27 wherein said second group of said four sources which are connected in common are connected to a bidirectional sense/driver circuit which drives the bit line common data of said two-bit memory cells.

30. The bit line decoding circuit of claim 27 wherein said third group of said four sources which are connected in common are connected to a bidirectional sense/driver circuit which drives the bit line right data of said two-bit memory cells.

31. The bit line decoding circuit of claim 24 wherein said bit line right data bidirectional sense/driver signal is combined as input to a selection switch with a bidirectional sense/driver right edge line wherein an edge right control signal's one or zero logic level selects between said two switch inputs.

32. The bit line decoding circuit of claim 24 wherein said bit line right data bidirectional sense/driver signal is combined as input to a selection switch with a bit line right data bidirectional sense/drive from an adjacent group of sixteen bit lines wherein said edge right control signal's one or zero logic level selects between said two switch inputs.

33. A method of decoding bit lines for accessing an array of two-bit memory cells comprising the steps of:

providing a first stage containing pass gates whose first nodes are connected to sixteen bidirectional bit lines, whose second nodes are connected to bidirectional intermediate nodes, and whose third nodes are connected to first stage control signals wherein said control signals drive pairs of bits of said first stage pass gates, wherein said first stage control signals drive said pairs of pass gates which are associated with bit lines 0 and 1, 2 and 3, 4 and 5, 6 and 7, 8 and 9, 10 and 11, 12 and 13, and 14 and 15, providing a second stage containing pass gates whose first nodes are connected to said bidirectional bit intermediate nodes, whose second nodes are connected to bidirectional sense driver lines, and whose third nodes are connected to second stage control signals, and providing bidirectional sense/driver circuits whose first nodes are from said second stage and whose second nodes are connected to selection switches which select which sense/driver circuit is accessed for reading or programming said two-bit memory cells.

34. The method of decoding bit lines of claim 33 wherein said first stage pass gates are comprised of N metal oxide semiconductor NMOS or P metal oxide semiconductor PMOS field effect transistors FETs whose drains are connected to said bidirectional bit lines, whose sources are connected to said bidirectional intermediate nodes and whose gates are connected to said first stage control signals.

35. The method of decoding bit lines of claim 33 wherein every fourth bit of said sixteen bidirectional intermediate nodes are connected together to form four separate intermediate junction nodes.

36. The method of decoding bit lines of claim 35 wherein said second stage pass gates are comprised of NMOS or PMOS FETs whose drains are connected to said intermediate junction nodes, whose every four sources are connected together to form bidirectional sense/driver nodes which connect to said bidirectional sense/driver circuits, and whose gates are connected to said second stage control signals.

37. The method of decoding bit lines of claim 36 wherein said first group of said four sources which are connected in common are connected to a bidirectional sense/driver circuit which drives the bit line left data of said two-bit memory cells.

38. The method of decoding bit lines of claim 36 wherein said second group of said four sources which are connected in common are connected to a bidirectional sense/driver circuit which drives the bit line common data of said two-bit memory cells.

39. The method of decoding bit lines of claim 36 wherein said third group of said four sources which are connected in common are connected to a bidirectional sense/driver circuit which drives the bit line right data of said two-bit memory cells.

40. The method of decoding bit lines of claim 33 wherein said bit line left data bidirectional sense/driver signal is combined as input to a selection switch with a bidirectional sense/driver left edge line wherein an edge left control signal's one or zero logic level selects between said two switch inputs.

41. The method of decoding bit lines of claim 33 wherein said bit line left data bidirectional sense/driver signal is combined as input to a selection switch with a bit line left data bidirectional sense/driver from an adjacent group of sixteen bit lines wherein said edge left control signal's one or zero logic level selects between said two switch inputs.

42. The method of decoding bit lines of claim 33 wherein said bit line right data bidirectional sense/driver signal is combined as input to a selection switch with a bidirectional sense/driver right edge line wherein an edge right control signal's one or zero logic level selects between said two switch inputs.

43. The method of decoding bit lines of claim 33 wherein said bit line right data bidirectional sense/driver signal is combined as input to a selection switch with a bit line right data bidirectional sense/driver from an adjacent group of sixteen bit lines wherein said edge right control signal's one or zero logic level selects between said two switch inputs.

44. A method of decoding bit lines for accessing an array of two-bit memory cells comprising the steps of:
providing a first stage containing pass gates whose first nodes are connected to sixteen bidirectional bit lines, whose second nodes are connected to a first set of bidirectional intermediate nodes, and whose third nodes are connected to first stage control signals wherein said control signals drive two pairs of bits of said first stage pass gates, wherein said first stage control signals drive said pairs of pass gates which are associated with bit lines 0 and 1, 2 and 3, 4 and 5, 6 and 7, 8 and 9, 10 and 11, 12 and 13, and 14 and 15,
providing a second stage containing pass gates whose first nodes are connected to said first set of bidirectional intermediate nodes, whose second nodes are connected to a second set of bidirectional intermediate nodes, and whos third nodes are connected to second stage control signals, wherein said control signals drive four or more bits of said second stage pass gates,
providing a third stage containing pass gates whose first nodes are connected to said second set of bidirectional bit intermediate nodes, whose second nodes are connected to bidirectional sense driver lines, and whose third nodes are connected to third stage control signals, and
providing bidirectional sense/driver circuits whose first nodes are from said second stage and whose second nodes are connected to selection switches which select which sense/driver circuit is accessed for reading or programming said two-bit memory cells.

45. The method of decoding bit lines of claim 44 where in said first stage pass gates are comprised of N metal oxide semiconductor NMOS or P metal oxide semiconductor PMOS field effect transistors FETs whose drains are connected to said bidirectional bit lines, whose sources are connected to said bidirectional intermediate nodes and whose gates are connected to said first stage control signals.

46. The method of decoding bit lines of claim 44 where in said second stage pass gates are comprised of N metal oxide semiconductor NMOS or P metal oxide semiconductor PMOS field effect transistors FETs whose drains are connected to said first set of bidirectional intermediate nodes, whose sources are connected to said second set of bidirectional intermediate nodes and whose gates are connected to said second stage control signals.

47. The method of decoding bit lines of claim 44 wherein every fourth bit of said sixteen bidirectional intermediate nodes are connected together to form four separate intermediate junction nodes.

48. The method of decoding bit lines of claim 47 wherein said second stage pass gates are comprised of NMOS or PMOS FETs whose drains are connected to said intermediate junction nodes, whose every four sources are connected together to form bidirectional sense/driver nodes which connect to said bidirectional sense/driver circuits, and whose gates are connected to said second stage control signals.

49. The method of decoding bit lines of claim 48 wherein said first group of said four sources which are connected in common are connected to a bidirectional sense/driver circuit which drives the bit line left data of said two-bit memory cells.

50. The method of decoding bit lines of claim 48 wherein said second group of said four sources which are connected in common are connected to a bidirectional sense/driver circuit which drives the bit line common data of said two-bit memory cells.

51. The method of decoding bit lines of claim 48 wherein said third group of said four sources which are connected in common are connected to a bidirectional sense/driver circuit which drives the bit line right data of said two-bit memory cells.

52. The method of decoding bit lines of claim 44 wherein said bit line left data bidirectional sense/driver signal is combined as input to a selection switch with a bidirectional sense/driver left edge line wherein an edge left control signal's one or zero logic level selects between said two switch inputs.

53. The method of decoding bit lines of claim 44 wherein said bit line left data bidirectional sense/driver signal is combined as input to a selection switch with a bit line left data bidirectional sense/driver from an adjacent group of sixteen bit lines wherein said edge left control signal's one or zero logic level selects between said two switch inputs.

54. The method of decoding bit lines of claim 44 wherein said bit line right data bidirectional sense/driver signal is combined as input to a selection switch with a bidirectional sense/driver right edge line wherein an edge right control signal's one or zero logic level selects between said two switch inputs.

55. The method of decoding bit lines of claim 44 wherein said bit line right data bidirectional sense/driver signal is combined as input to a selection switch with a bit line right data bidirectional sense/driver from an adjacent group of sixteen bit lines wherein said edge right control signal's one or zero logic level selects between said two switch inputs.

56. A method of decoding bit lines for accessing an array of two-bit memory cells comprising the steps of:
providing a first stage containing pass gates whose first nodes are connected to sixteen bidirectional bit lines, whose second nodes are connected to bidirectional intermediate nodes, and whose third nodes are connected to first stage control signals wherein said control signals drive pairs of bits of said first stage pass gates, wherein said first stage control signals drive said pairs of pass gates which are associated with bit lines 1 and 2, 3 and 4, 5 and 6, 7 and 8, 9 and 10, 11 and 12, 13 and 14, and 15 and 0 (of next group of 16 bit lines),
providing a second stage containing pass gates whose first nodes are connected to said bidirectional bit intermediate nodes, whose second nodes are connected to bidirectional sense driver lines, and whose third nodes are connected to second stage control signals, and
providing bidirectional sense/driver circuits whose first nodes are from said second stage and whose second nodes are connected to selection switches which select which sense/driver circuit is accessed for reading or programming said two-bit memory cells.

57. The method of decoding bit lines of claim 56 where in said first stage pass gates are comprised of N metal oxide semiconductor NMOS or P metal oxide semiconductor PMOS field effect transistors FETs whose drains are connected to said bidirectional bit lines, whose sources are connected to said bidirectional intermediate nodes and whose gates are connected to said first stage control signals.

58. The method of decoding bit lines of claim 56 wherein every fourth bit of said sixteen bidirectional intermediate nodes are connected together to form four separate intermediate junction nodes.

59. The method of decoding bit lines of claim 58 wherein said second stage pass gates are comprised of NMOS or PMOS FETs whose drains are connected to said intermediate junction nodes, whose every four sources are connected together to form bidirectional sense/driver nodes which connect to said bidirectional sense/driver circuits, and whose gates are connected to said second stage control signals.

60. The method of decoding bit lines of claim 59 wherein said first group of said four sources which are connected in common are connected to a bidirectional sense/driver circuit which drives the bit line left data of said two-bit memory cells.

61. The method of decoding bit lines of claim 59 wherein said second group of said four sources which are connected in common are connected to a bidirectional sense/driver circuit which drives the bit line common data of said two-bit memory cells.

62. The method of decoding bit lines of claim 59 wherein said third group of said four sources which are connected in common are connected to a bidirectional sense/driver circuit which drives the bit line right data of said two-bit memory cells.

63. The method of decoding bit lines of claim 56 wherein said bit line right data bidirectional sense/driver signal is combined as input to a selection switch with a bidirectional sense/driver right edge line wherein an edge right control signal's one or zero logic level selects between said two switch inputs.

64. The method of decoding bit lines of claim 56 wherein said bit line right data bidirectional sense/driver signal is combined as input to a selection switch with a bit line right data bidirectional sense/driver from an adjacent group of sixteen bit lines wherein said edge right control signal's one or zero logic level selects between said two switch inputs.

* * * * *